United States Patent [19]
An et al.

[11] Patent Number: 6,100,769
[45] Date of Patent: Aug. 8, 2000

[54] DIFFERENTIAL DELAY CIRCUIT FOR A VOLTAGE-CONTROLLED OSCILLATOR

[75] Inventors: Byung-Kwon An, Kunpo; Byung-Hun Han, Goyang, both of Rep. of Korea

[73] Assignee: Samsung Electronics Co., Ltd., Rep. of Korea

[21] Appl. No.: 09/274,401

[22] Filed: Mar. 23, 1999

[30] Foreign Application Priority Data

Jun. 22, 1998 [KR] Rep. of Korea .................. 98-23489

[51] Int. Cl.⁷ .................................................. H03B 5/02
[52] U.S. Cl. ..................................... 331/57; 331/177 R
[58] Field of Search .................................. 331/57, 177 R

[56] References Cited

U.S. PATENT DOCUMENTS

| | | | |
|---|---|---|---|
| 5,568,099 | 10/1996 | Du | 331/57 |
| 5,847,616 | 12/1998 | Ng et al. | 331/57 |
| 5,961,577 | 10/1999 | Soenen et al. | 708/251 |
| 5,994,969 | 11/1999 | Bujanos | 331/57 |

*Primary Examiner*—Siegfried H. Grimm
*Attorney, Agent, or Firm*—Samuels, Gauthier & Stevens LLP

[57] ABSTRACT

A differential delay circuit type ring oscillator allows for an increase in operation enabling frequency and dynamic range. At each stage of the ring, delay circuit output signals arc linearly varied above and below the circuit switching level. The ring oscillator includes a plurality of differential delay circuits coupled in series in a ring configuration, a differential amplifier, and a comparator. Each of the differential delay circuits receives first and second differential input signals, and delays the received signals by a predetermined time in response to a predetermined control signal to generate first and second differential output signals. The differential amplifier receives the first and the second differential output signals of one of the differential delay circuits and amplifies the received signals to generate first and second differential amplified signals. The comparator receives first and the second differential amplified signals, and compares them to generate an oscillating signal in accordance with the comparison results.

11 Claims, 5 Drawing Sheets

DIFFERENTIAL DELAY CIRCUIT FOR A VOLTAGE-CONTROLLED OSCILLATOR

BACKGROUND OF THE INVENTION

1. Field of the Invention

The present invention relates to a differential delay circuit for use in a voltage controlled oscillator employed in a phase lock loop, and more particularly, to a ring-type voltage controlled oscillator.

2. Description of the Related Art

A voltage controlled oscillator (VCO) varies an oscillation frequency in accordance with a voltage received from a phase locked loop (PLL). A resistor-capacitor (RC) multivibrator, or a ring oscillator, is typically employed as the VCO. The ring oscillator includes a plurality of inverters or differential delay cells connected in series with each other in the form of a ring, and oscillates with delay time.

In general, an oscillation signal of the VCO includes jitter due to internally and externally-generated noise. Internal noise sources include thermal noise and shot noise of active devices and passive devices of the VCO circuit. External noise is usually generated by a power supply, and can be attenuated by enhancing the power supply ripple rejection ratio using a differential-type delay cell.

Figure 1:
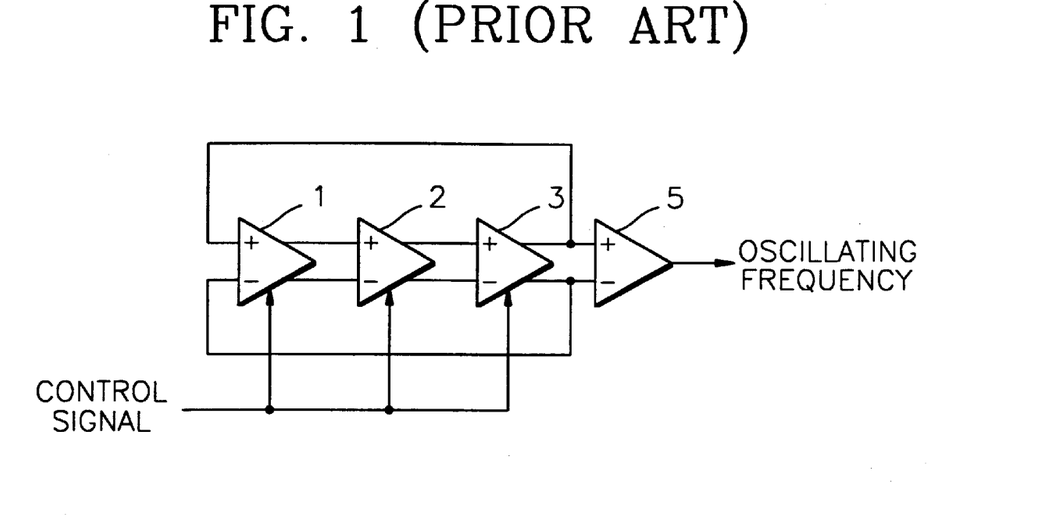
FIG. 1 is a schematic block diagram of conventional voltage controlled oscillator using a differential delay circuit.

A conventional VCO employing a differential delay circuit is schematically depicted in FIG. 1. In FIG. 1, the VCO includes a plurality of differential delay cells 1, 2, and 3 and a comparator 5. Each of the differential delay cells 1, 2, and 3 receives a differential input signal and outputs delayed signals. The comparator 5 compares the differential output signals of the final differential delay cell 3 in the series to determine the output logic level. In this manner, the VCO oscillates a pulse signal having a periodically inverted logic level.

Figure 2:
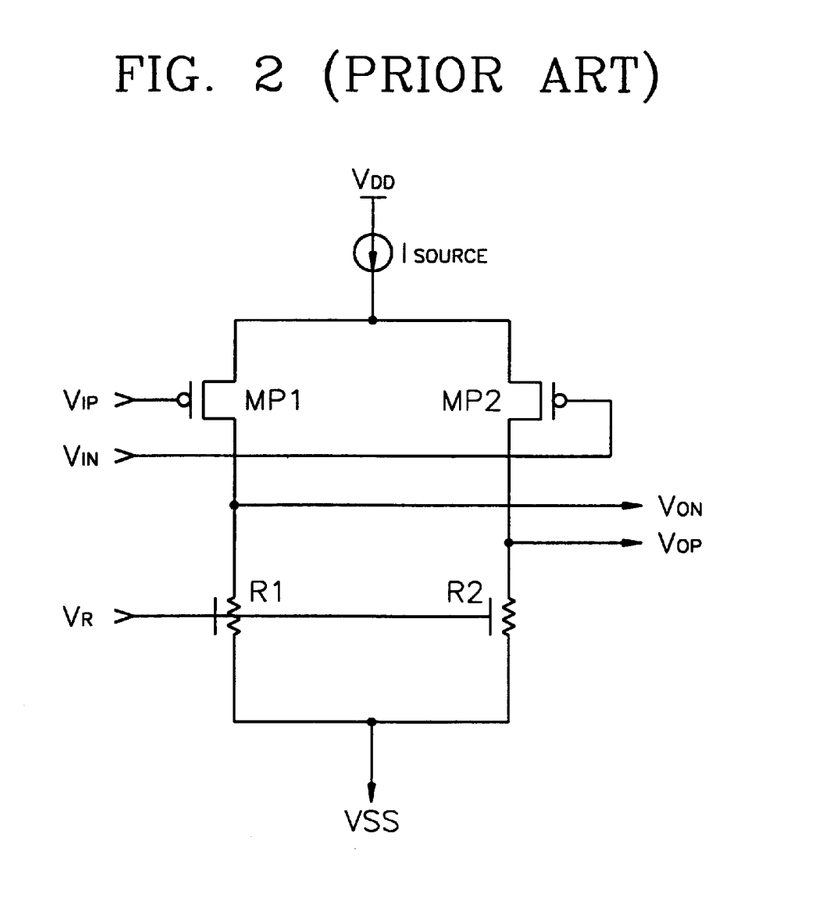
FIG. 2 is a circuit diagram of the differential delay circuit of FIG. 1.

FIG. 2 is a schematic diagram of a differential delay cell 1, 2, 3 of FIG. 1. Assuming the first differential input signal $V_{IP}$ is logic high and the second differential input signal $V_{IN}$ is logic low, transistor MP1 is turned off, or inactive, and transistor MP2 is turned on, or active. Thus, positive output $V_{OP}$ is high and negative output $V_{ON}$ is low. There is a propagation delay time between the input signals $V_{IP}$ and $V_{IN}$ and the output signals $V_{OP}$ and $V_{ON}$. Assuming the first differential input signal $V_{IP}$ is low and the second differential input signal $V_{IN}$ is high, the positive output $V_{OP}$ becomes low and the negative output $V_{ON}$ becomes high, and there is again a propagation delay time between the input and the output signals. Resistance values of variable resistors R1 and R2 are variable in response to a control voltage $V_R$, so that the resistance values, and therefore the output voltage levels, are maintained, even if the current supplied by the current source $I_{SOURCE}$ is varied.

In the above-described differential delay cell, the propagation delay time $t_d$ of the cell is expressed by:

$$t_d \cong V_{pp}\left(\frac{C_L}{I_{source}}\right) \quad (1)$$

Where $V_{PP}$ denotes a peak-to-peak level of the differential input voltage, $C_L$, or load capacitance, denotes the total parasitic capacitance of the output terminal of the differential delay cell, and $I_{SOURCE}$ denotes the current supplied by the current source.

As shown in Equation 1, the propagation delay time $t_d$ is proportional to the peak-to-peak level of the differential input voltage and inversely proportional to the current source $I_{SOURCE}$. It is preferable to reduce the propagation delay time $t_d$ in order to increase the operation enabling frequency and dynamic range of the VCO. The propagation delay time $t_d$ can be reduced by decreasing the peak-to-peak level $V_{PP}$ of the differential input voltages, or by increasing the amount of the source current $I_{SOURCE}$. However, if the peak-to-peak level $V_{PP}$ is reduced to less than a critical level, the comparator 5 is no longer sensitive enough to respond to the output of the delay cells. Thus, a method for reducing the peak-to-peak level $V_{PP}$ of the differential input voltages, without adversely affecting the operation of the comparator 5, is desired.

Figure 3:
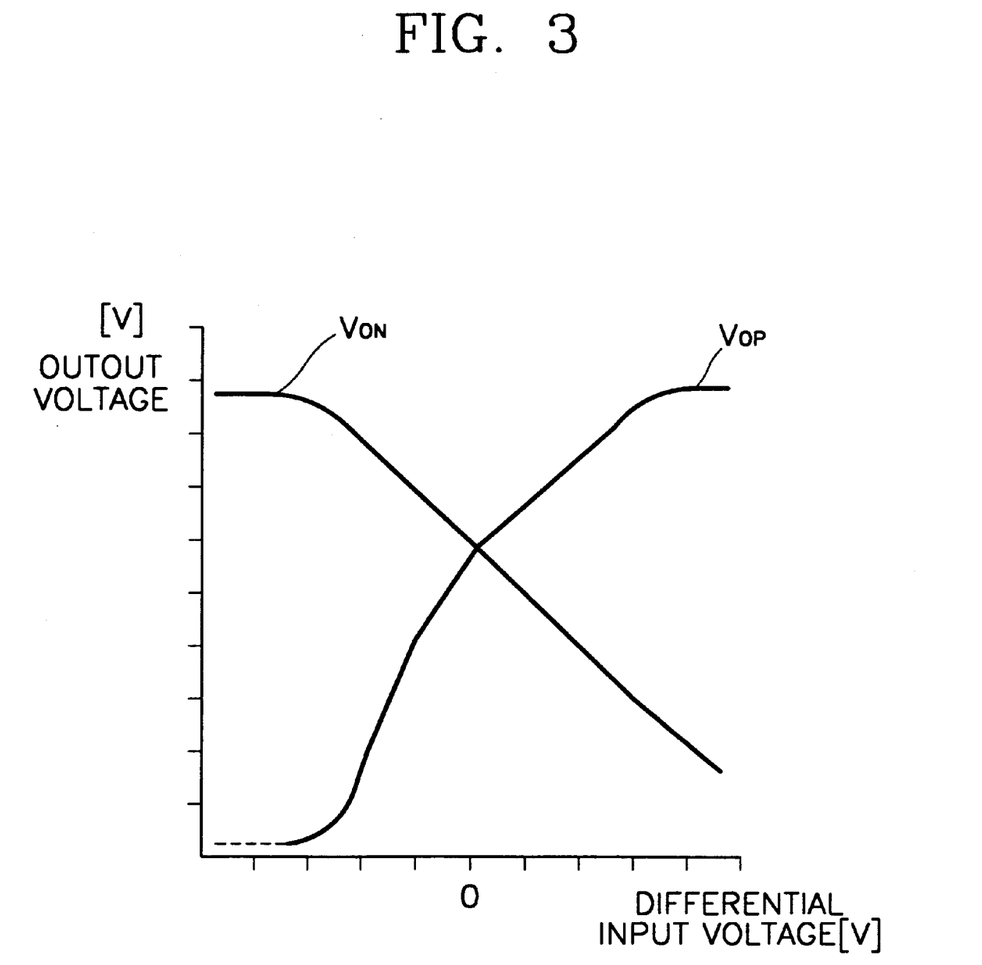
FIG. 3 is a graph illustrating input and output characteristics of the differential delay circuit of FIG. 2.

Referring to FIG. 2, variable resistors R1 and R2 include diode-connected transistors. However, over a certain range of control voltage, $V_R$, the transistors operate non-linearly, until the transistors are fully activated and current flows. Thus, as shown in FIG. 3, the input/output characteristic of the delay cell of FIG. 2 includes distortion. Preferably, each of the output signals $V_{ON}$, $V_{OP}$ is linearly varied when the voltage level of the positive differential input is the same as that of the negative differential input. However, before and after the switching level of the delay cell of FIG. 2, each of the output signals varies non-linearly, and the resulting differential output for the positive differential input is smaller than that for the negative differential input. This non-linear characteristic leads to unstable operation of the VCO.

SUMMARY OF THE INVENTION

To address the above-mentioned shortcomings of conventional techniques, it is an objective of the present invention to provide a differential-delay circuit type ring oscillator having a high operation enabling frequency, a wide dynamic range, and linearly-varied output signals.

To achieve the above objective, a voltage controlled oscillator according to the present invention includes a plurality of differential delay circuits, a differential amplifier, and a comparator. The plurality of differential delay circuits are connected in the form of a ring. Each receives first and second differential input signals, and delays the received input signals for a predetermined time in response to a control signal to generate first and second differential output signals. The differential amplifier receives the first and the second differential output signals of one of the differential delay circuits in the ring, and amplifies the received input signals to generate first and second differential amplifying signals. The comparator receives and compares the first and the second differential amplifying signals, to generate an oscillating output signal in response to the comparison results.

In each of the plurality of differential delay circuits, a current source generates a current level which is varied by the control signal to supply the generated current to a delay circuit. A first transistor has a source connected to an output terminal of the current source, a drain connected to a first output node, and a gate for receiving the first differential input signal. A second transistor has a source connected to an output terminal of the current source, a drain connected to the first output node, and a gate through which the second differential input signal is received. A third transistor has a source connected to an output terminal of the current source, a drain connected to a second output node, and a gate through which the first differential input signal is received. A fourth transistor has a source connected to an output terminal of the current source, a drain connected to the second output node, and a gate through which the second differential input signal is received. Since transistor pairs receiving complementary inputs through a gate are used for each of the output nodes, the linearity of the output signal with respect to the input signal is thereby improved. This results in a vast improvement in symmetry between the output signals resulting from positive and negative differential inputs.

According to the present invention, the linearity of the output signal with respect to the input signal in each of the differential delay cell circuits is increased, resulting in improved stability in the voltage control oscillator. An amplifier is added between the ring of differential delay cells and the comparator, to maintain the input and output voltages of each of the differential delay cells at a low level as compared to conventional configuration. In this manner, the oscillating frequency of the VCO can be increased, and thus the operation enabling frequency of the VCO is increased, to widen dynamic range.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 4:
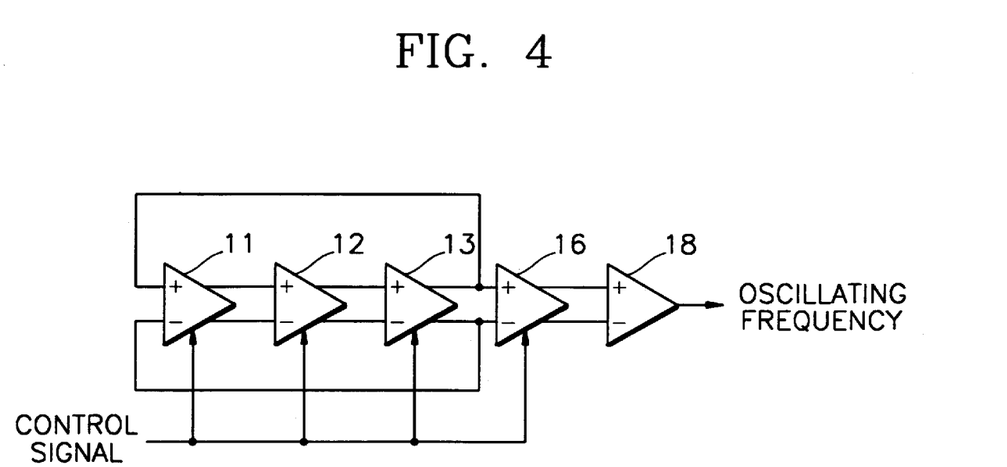
FIG. 4 is a schematic block diagram of a voltage controlled oscillator according to the present invention.

Referring to FIG. 4, the voltage controlled oscillator (VCO) includes a plurality of differential delay cells 11, 12, 13, an amplifier 16, and a comparator 18. Each of the differential delay cells 11, 12, 13 receives differential input signals and control signals, delays the differential input for a predetermined time in accordance with the control signal, and outputs the delayed differential output signals. The amplifier 16 receives differential output signals of one of the differential delay cells, for example cell 13, and amplifies the received signals to generate first and second differential amplified signals. The comparator 18 receives and compares the first and second differential amplified signals to generate an output oscillation signal in accordance with comparison results.

Figure 5:
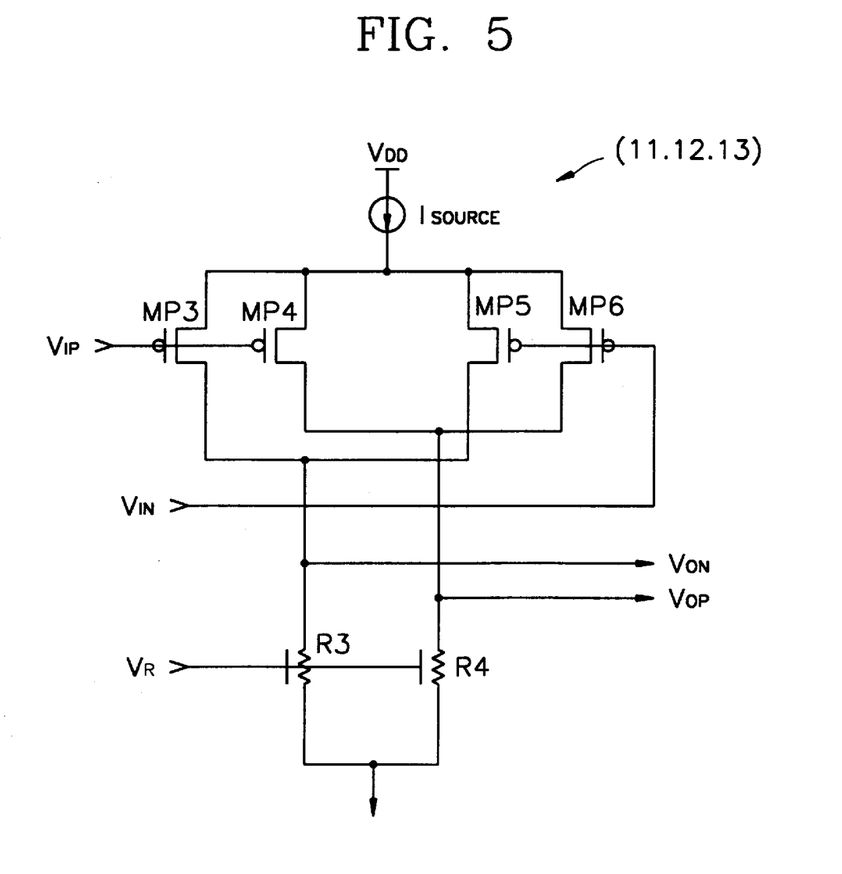
FIG. 5 is a schematic circuit diagram of the differential delay circuit of FIG. 4.

FIG. 5 is a schematic diagram of each of the differential delay cells 11, 12, 13 of FIG. 4. A current source $I_{SOURCE}$ supplies a variable amount of current according to a control signal $V_{CTL}$ (shown in FIGS. 6 and 7, below). Transistor MP3 has a source connected to an output terminal of the current source $I_{SOURCE}$, a drain grounded through a resistor R3, and a gate receiving the first differential input signal $V_{IP}$. Transistor MP4 has a source connected to an output terminal of the current source, a drain grounded through a resistor R4, and a gate receiving the first differential input signal $V_{IP}$. Transistor MP5 has a source connected to the output terminal of the current source, a drain connected to the drain of the transistor MP3, and a gate receiving a second differential input signal $V_{IN}$. Transistor MP6 has a source connected to the output terminal of the current source, a drain connected to the drain of the transistor MP4, and a gate through which the second differential input signal $V_{IN}$ is received. Resistors R3 and R4 vary resistance values in accordance with the control voltage $V_R$.

In a preferred embodiment of the present invention, aspect ratios (W/L) of transistors MP3 and MP6 are the same, as are aspect ratios of transistors MP4 and MP5. Preferably, the W/L ratios of transistors MP3 and MP6 are 4~5 times those of the transistors MP4 and MP5. However, the aspect ratios of the transistors are not limited to the above-described ratios, and may have various ratios in other embodiments.

Figure 6:
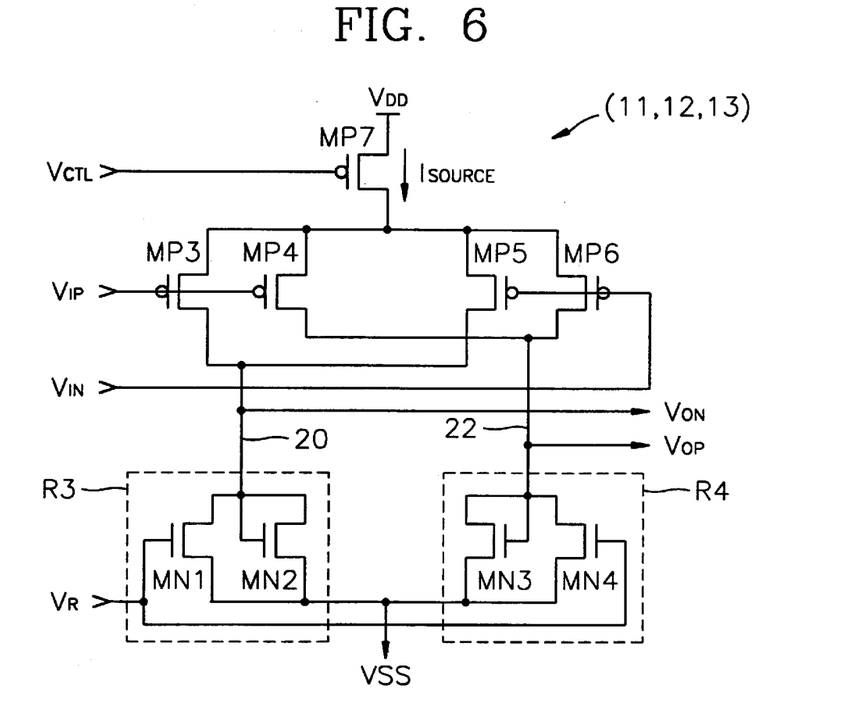
FIG. 6 is a detailed circuit diagram of the differential delay circuit of FIG. 5.

FIG. 6 schematically illustrates the differential delay cell of FIGS. 4 and 5 in further detail. The current source includes a transistor MP7 having a source connected to a power supply level $V_{dd}$, and a drain connected to the power supply output. The control signal $V_{CTL}$ is input to a gate of the transistor MP7. In this manner, the current $I_{SOURCE}$ supplied by transistor MP7 is varied in accordance with control signal $V_{CTL}$. The control signal $V_{CTL}$ is a obtained by low-bandpass filtering a phase difference detection signal detected from a phase detector (not shown) of a phase-locked loop (PLL).

Resistor R3 comprises NMOS transistors MN1 and MN2. In transistor MM1, a drain is connected to a node 20, a source is grounded, and a gate receives the control voltage $V_R$. In transistor MN2, a drain and a gate are connected to each other and diode-connected to the node 20, and a source is grounded. Thus, the resistance of resistor R3 is varied by the control voltage $V_R$, and the control voltage is input from an external circuit such that a current level is constantly maintained while the current $I_{SOURCE}$ of the current source is varied. Resistor R4 comprises NMOS transistors MN3 and MN4. In transistor MN4, a drain is connected to the node 20, a source is grounded, and a gate receives the control voltage $V_R$. In the transistor MN3, a drain and a gate are connected to each other, and they are diode-connected to a node 22, and a source is grounded. Thus, the resistor R4 is varied by the control voltage $V_R$.

Figure 8:
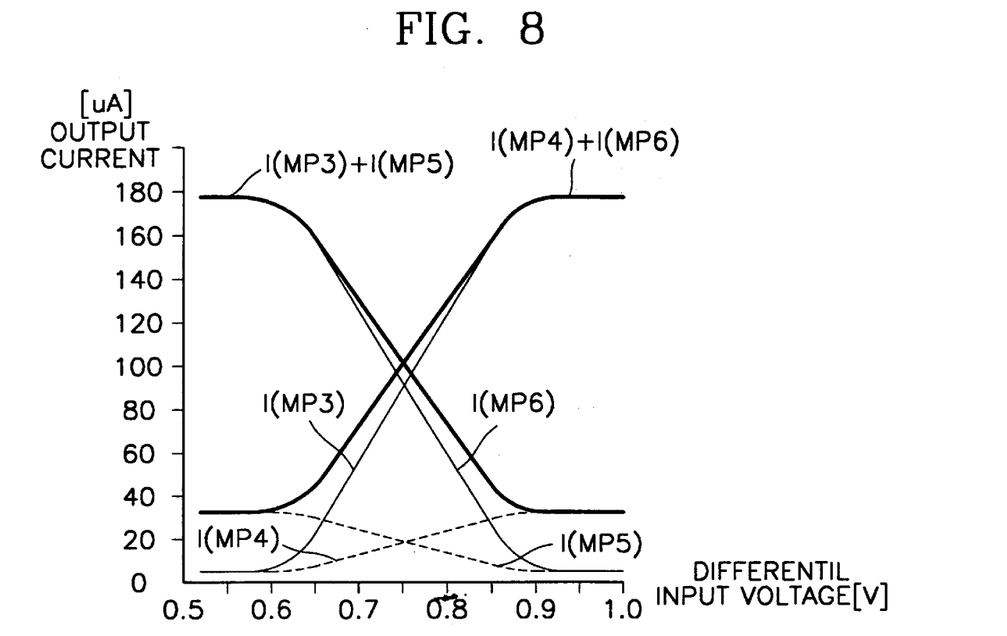
FIG. 8 is a graph of current flowing through each transistor of the differential delay circuit of FIG. 5.
Figure 9:
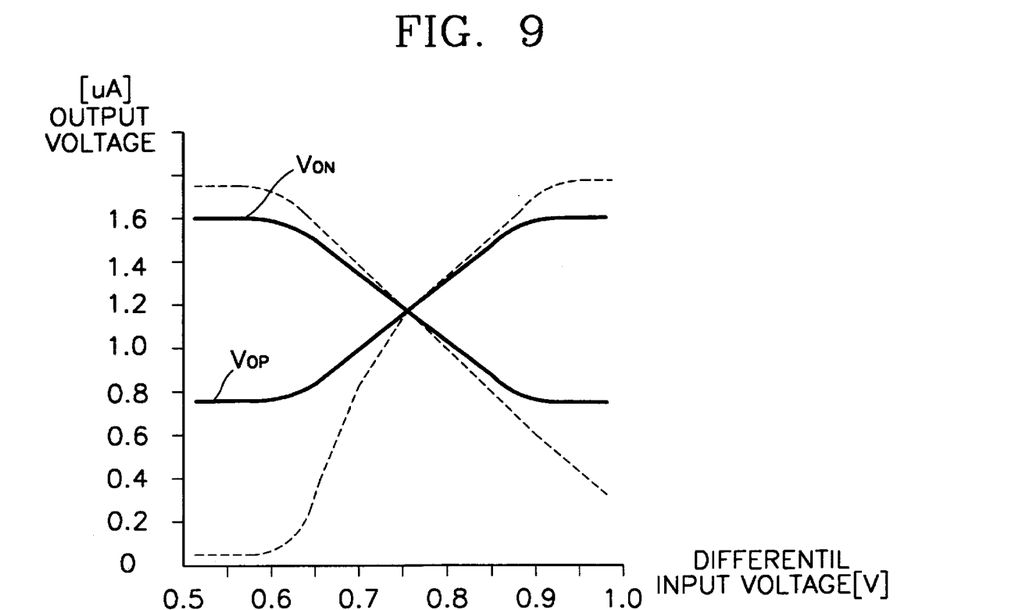
FIG. 9 is a graph illustrating input and output characteristics of the differential delay circuit of FIG. 4.

The operation of the differential delay cells 11, 12, 13 of FIG. 5 will now be described with reference to FIGS. 8 and 9.

If the first differential input signal $V_{IP}$ is high and the second differential input signal $V_{IN}$ is low, and thus a differential input voltage of a differential delay cell has a low value, transistors MP3 and MP4 are turned off and the transistors MP5 and MP6 are turned on. Thus, as shown in FIG. 8, little or no current flows through transistors MP3 and MP4, and high current flows through transistors MP5 and MP6. Also, due to the difference of the aspect ratios of the transistors, the current flowing in transistor MP3 is 4~5 times higher than that of the current flowing in transistor MP4, and the current flowing in transistor MP6 is 4~5 times higher than the current flowing in transistor MP5.

If the first differential input signal $V_{IN}$ is low and the second differential input signal $V_{IN}$ is high, and thus the differential input voltage of the differential delay cell has a high value, transistors MP3 and MP4 are turned on and transistors MP5 and MP6 are turned off. Thus, as shown in FIG. 8, large current flows though transistors MP3 and MP4, and little or no current flows through transistors MP5 and MP6. Also, due to the difference of the aspect ratios of the transistors, the current flowing in transistor MP3 is 4~5 times higher than that flowing in transistor MP4, and the current flowing in transistor MP6 is 4~5 times higher than that flowing in transistor MP5.

The currents flowing in transistors MP3 and MP5 pass through resistor R3, and the currents flowing in transistors MP4 and MP6 pass through resistor R4. The current flowing through resistor R3, i.e., I(MP3)+(MP5), and the current flowing in the resistor R4, i.e., I(MP4)+(MP6) are indicated by thick solid lines in FIG. 8. The current levels flowing in resistors R3 and R4 are symmetrical with respect to the change of the differential input voltage. The differential output signals $V_{OP}$ and $V_{ON}$ are the same as the voltage drop in each of the resistors R4 and R5, so that the levels of the differential output signals $V_{OP}$ and $V_{ON}$ are symmetrical with respect to the change of the differential input voltage as shown in FIG. 9. Also, while the differential input voltage is changed, the linearity of the differential output voltage is improved as compared to the conventional art shown by dashed lines in FIG. 9.

That is, in a voltage controlled oscillator according to the present invention, source-coupled transistor-pairs are used in each of the differential delay cells, to thereby increase the linearity of the output with respect to the input of the differential delay cell.

Figure 7:
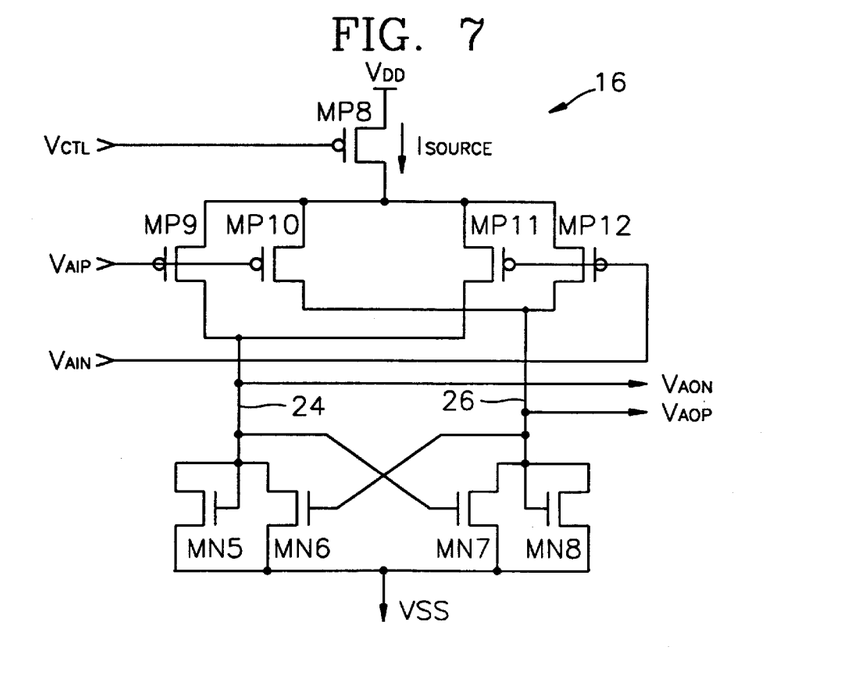
FIG. 7 is a detailed circuit diagram of amplifier 16 of FIG. 4.

FIG. 7 is a detailed circuit diagram of the amplifier 16 of FIG. 4. Referring to FIG. 7, the amplifier 16 has a structure similar to that of each of the differential delay cells 11, 12, and 13. That is, the current source variously supplies the amount of source current $I_{SOURCE}$ according to the control signal $V_{CTL}$. Transistor MP9 has a source connected to an output terminal of the current source, a drain connected to a node 24, and a gate receiving differential output signals $V_{AIP}$ of the differential delay cell 13. Transistor MP10 has a source connected to an output terminal of the current source, a drain connected to a node 26, and a gate receiving differential output signals $V_{AIP}$ of the differential delay cell 13. Transistor MP11 has a source connected to an output terminal of the current source, a drain connected to a the drain of the transistor MP9, and a gate receiving differential output signals $V_{AIN}$ of the differential delay cell 13. Transistor MP12 has a source connected to an output terminal of the current source, a drain connected to the drain of the transistor MP10, and a gate receiving differential output signals $V_{AIN}$ of the differential delay cell 13.

In transistor MN5, a drain and a gate are connected to each other and diode-connected to node 24, and a source is grounded. A drain of transistor MN6 is connected to node 24, a source is grounded, and a gate receives the voltage of node 26. A drain of transistor MN7 is connected to node 26, a source is grounded, and a gate receives the voltage of node 24. In transistor MN8, a drain and a gate are connected to each other, and diode-connected to node 26, and a source is grounded. The above-described amplifier 16 amplifies output signals of the differential delay cell 13 and thus outputs the amplified signals $V_{AON}$ and $V_{AOP}$ to the comparator 18.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A voltage controlled oscillator comprising:

a plurality of differential delay circuits serially connected in a ring, each delay circuit receiving first and second differential input signals, and delaying the received input signals for a time delay to generate first and second differential output signals;

a differential amplifier receiving the first and the second differential output signals of one of the differential delay circuits and amplifying the received input signals to generate first and second differential amplified signals; and a comparator receiving the first and second differential amplified signals, and comparing the first and second differential amplified signals to generate an oscillating output signal in response to the comparison results.

2. The voltage controlled oscillator of claim 1, wherein each of the plurality of differential delay circuits comprises:

a current source for generating variable current output in accordance with a control signal;

a first transistor having a source for receiving the current output of the current source, a drain connected to a first output node, and a gate for receiving the first differential input signal;

a second transistor having a source for receiving the current output of the current source, a drain connected to the first output node, and a gate for receiving the second differential input signal;

a third transistor having a source for receiving the current output of the current source, a drain connected to a second output node, and a gate for receiving the first differential input signal;

a fourth transistor having a source for receiving the current output of the current source, a drain connected to the second output node, and a gate for receiving the second differential input signal;

a first active load connected between the first output node and ground; and a second active load connected between the second output node and ground.

3. The voltage controlled oscillator of claim 2, wherein first aspect ratios of the first and the fourth transistors are the same, and second aspect ratios of the second and the third transistors are the same.

4. The voltage controlled oscillator of claim 3, wherein the first aspect ratios of the first and the fourth transistors are approximately four times greater than the second aspect ratios of the second the third transistors.

5. The voltage controlled oscillator of claim 3, wherein the first aspect ratios of the first and the fourth transistors are approximately five times greater than the second aspect ratios of the second and the third transistors.

6. The voltage controlled oscillator of claim 2 wherein the first and second active loads have resistance values which are variable in response to a second control voltage.

7. The voltage controlled oscillator of claim 6 wherein the first active load comprises fifth and sixth transistors and wherein the second active load comprises seventh and eighth transistors;

the drains of the fifth and sixth transistors being coupled to the first output node, and the drains of the seventh and eighth transistors being coupled to the second output nodes respectively; and the gates of the fifth and eighth transistors being coupled to a second control voltage and the gates of the sixth and seventh transistors being coupled to the first and second output nodes respectively; and the sources of the fifth, sixth, seventh, and eighth transistors being coupled to the ground.

8. The voltage controlled oscillator of claim 1 wherein the time delay is variable in response to a control signal.

9. The voltage controlled oscillator of claim 1, wherein the amplifier comprises:

a current source for generating variable current output in accordance with a control signal;

a first transistor having a source for receiving the current output of the current source, a drain connected to a first output node, and a gate for receiving the first differential input signal;

a second transistor having a source for receiving the current output of the current source, a drain connected to the first output node, and a gate for receiving the second differential input signal;

a third transistor having a source for receiving the current output of the current source, a drain connected to a second output node, and a gate for receiving the second differential input signal;

a fourth transistor having a source for receiving the output of the current source, a drain connected to the second output node, and a gate for receiving the second differential input signal;

a first active load connected between the first output node and ground; and a second active load connected between the second output node and ground.

10. The voltage controlled oscillator of claim 9 wherein the first and second active loads have resistance values which are variable in response to a second control voltage.

11. The voltage controlled oscillator of claim 10, wherein the first active load comprises fifth and sixth transistors and wherein the second active load comprises seventh and eighth transistors;

the drains of the fifth and sixth transistors being coupled to the first output node, and the drains of the seventh and eighth transistors being coupled to the second output node;

the gates of the fifth and eighth transistors being coupled to the second and first output nodes respectively and the gates of the sixth and seventh transistors being coupled to the first and second output nodes respectively;

the sources of the fifth, sixth, seventh, and eighth transistors being coupled to the ground.

* * * * *

UNITED STATES PATENT AND TRADEMARK OFFICE
CERTIFICATE OF CORRECTION

PATENT NO.    : 6,100,769
DATED         : August 8, 2000
INVENTOR(S)   : Byung-Kwon An and Byung-Hun Han It is certified that error appears in the above-identified patent and that said Letters Patent is hereby corrected as shown below:

<u>Column 7,</u>
Line 4, delete "nodes respectively; and" and insert -- node; --.

Signed and Sealed this

Eleventh Day of June, 2002

*Attest:*

*Attesting Officer*

JAMES E. ROGAN
*Director of the United States Patent and Trademark Office*